(12) United States Patent
Büming et al.

(10) Patent No.: US 11,971,436 B2
(45) Date of Patent: Apr. 30, 2024

(54) METHOD AND SYSTEM FOR DETERMINING A PHASE SHIFT BETWEEN A PHASE CURRENT AND A PHASE VOLTAGE

(71) Applicant: Bombardier Primove GmbH, Berlin (DE)

(72) Inventors: Andreas Büming, Maxdorf (DE); Christian Salewski, Speyer (DE); Thomas Nikles, Mannheim (DE); Andreas Kappmeier, Mannheim (DE); Robert Czainski, Zelona Góra (PL)

(73) Assignee: Bombardier Primove GmbH, Berlin (DE)

( * ) Notice: Subject to any disclaimer, the term of this patent is extended or adjusted under 35 U.S.C. 154(b) by 314 days.

(21) Appl. No.: 17/414,558

(22) PCT Filed: Dec. 18, 2019

(86) PCT No.: PCT/EP2019/085889
§ 371 (c)(1),
(2) Date: Jun. 16, 2021

(87) PCT Pub. No.: WO2020/127446
PCT Pub. Date: Jun. 25, 2020

(65) Prior Publication Data
US 2022/0011354 A1 Jan. 13, 2022

(30) Foreign Application Priority Data
Dec. 20, 2018 (GB) ..................... 1820814

(51) Int. Cl.
*G01R 25/00* (2006.01)
*G01R 15/18* (2006.01)
*H04B 5/00* (2006.01)

(52) U.S. Cl.
CPC ........... *G01R 25/00* (2013.01); *G01R 15/181* (2013.01); *H04B 5/0037* (2013.01)

(58) Field of Classification Search
None
See application file for complete search history.

(56) References Cited

U.S. PATENT DOCUMENTS

| 5,239,252 A | 8/1993 | Runggaldier et al. |
| 9,652,700 B2 | 5/2017 | Saiki et al. |
| (Continued) | | |

FOREIGN PATENT DOCUMENTS

| EP | 3006947 A1 | 4/2016 |
| JP | 2005102350 A | 4/2005 |
| (Continued) | | |

OTHER PUBLICATIONS

Machine English Translation of JP2007300762 to Uesugi (Year: 2007).*

(Continued)

*Primary Examiner* — Douglas X Rodriguez
(74) *Attorney, Agent, or Firm* — Downs Rachlin Martin PLLC (57) ABSTRACT

A method and a system for determining a phase shift between a phase current and a phase voltage in an AC phase line of a converter. A method and a system for determining a phase shift between a phase current and a phase voltage in an AC phase line of a converter, in particular a converter of a system for inductive power transfer, wherein a phase current change dependent quantity is determined, wherein a voltage-specific reference time point is determined depending on the phase current change dependent quantity, wherein the phase current is determined, wherein a current-specific reference time point is determined depending on the phase current, wherein the phase shift is determined depending on (Continued)

the time difference between the voltage-specific reference time point and the current-specific reference time point.

16 Claims, 3 Drawing Sheets

(56) References Cited

U.S. PATENT DOCUMENTS

2007/0290645 A1\* 12/2007 Boyadjieff .......... H02M 1/4208
318/437
2018/0113161 A1\* 4/2018 Hines ................ G01R 29/0878

FOREIGN PATENT DOCUMENTS

| JP | 2007300762 | A | \* | 11/2007 |
|----|------------|---|---|---------|
| JP | 2007300762 | A |   | 11/2007 |
| JP | 2013539537 | A |   | 10/2013 |
| KR | 101358051  | B |   | 2/2014  |
| WO | 2010103332 | A1|   | 9/2010  |

OTHER PUBLICATIONS

International Search Report and Written Opinion dated Mar. 26, 2020, in connection with PCT/EP2019/085889 filed Dec. 18, 2019.
Meins, Jurgen, Czainski, Robert, Turki, Faical; Phase Characteristics of Resonant Contactless High Power Supplies; Technical University of Braunschweig; published at the following conference: XIV International Symposium on Theoretical Electrical Engineering ISTET'07 At: Szczecin, Polen Jun. 20-23, 2007.

\* cited by examiner

METHOD AND SYSTEM FOR DETERMINING A PHASE SHIFT BETWEEN A PHASE CURRENT AND A PHASE VOLTAGE

A method and system for determining a phase shift between a phase current and a phase voltage The invention relates to a method and a system for determining a phase shift between a phase current and a phase voltage in an AC (alternating current) phase line of a converter, in particular in a converter of a system for inductive power transfer.

To minimize switching losses and to perform an efficient inductive power transfer, it is desirable to provide an AC output voltage and an AC phase current of/in the converter which are in phase. A load connected to the converter can be assumed to be an impedance $$Z=R+jX \qquad \text{formula 1}$$

Wherein R denotes a resistance and X a reactance of the load. The value of the impedance depends on the impedance of the load, in particular of the primary winding structure, and, if present, the impedance of a secondary winding structure.

The reactance can be minimized if the operating frequency, i.e. the frequency of the alternating electromagnetic field for power transfer, is equal to a resonant frequency of the resonant circuit connected to an AC output of the converter.

The output AC voltage or the output phase current can be provided as a square wave. In this case, such a signal can have a fundamental frequency and harmonic frequencies.

Different techniques to reduce losses of the converter are known. One technique is to adapt the reactance of components an electric circuit connected to AC output terminals of the converter, e.g. by adding electric components or changing their reactance value.

Another method is to adapt the operating frequency of the converter, e.g. the fundamental frequency of the square wave AC output voltage or AC output current.

Power losses of the converter can be estimated based on the phase shift between AC phase voltage and AC phase current of the converter as the phase shift allows determining the impedance, namely the reactance X, of the electric circuit connected to AC terminals. For a certain converter topology, a reduction of the phase shift also leads to smaller the power losses.

It is an object of the present invention to provide a precise and computationally efficient method and system for determining a phase shift between a phase current and a phase voltage in an AC phase line of a converter, in particular a converter of a system for inductive power transfer.

The solution of said technical problem is provided by the subject-matter with the features of claim 1 and claim 9. Further advantageous embodiments are provided by the subject-matter with the features of the sub claims.

A method for determining a phase shift between a phase current and a phase voltage in at least one AC phase line of a converter is proposed.

The converter can be a converter of a system for inductive power transfer, in particular to a vehicle. Moreover, a converter can provide an alternating operating voltage to a primary winding structure of the system for inductive power transfer in order to generate the electromagnetic power transfer field.

The converter can be an inverter. An inverter provides an AC output voltage from a DC input voltage, whereas a converter can also provide an AC output voltage from an AC input voltage. Also, an inverter can provide an AC output current from a DC input current whereas a converter can provide an AC output current form and AC input current. In the following explanations related to an inverter can also be related to a converter if suitable.

The primary winding structure can be a three phase winding structure. In this case, the inverter can be a three phase converter. In particular, a three phase inverter can have a so called B6 bridge topology. In particular, the inverter can comprise at least one leg with series connection of two switching elements. A high potential terminal of a first switching element of the series connection can be connected to a high potential DC phase line. A second terminal of the first switching element can be connected to a first terminal of the second switching element. A second terminal of the second switching element can be electrically connected to a low potential DC phase line. An AC phase line of the inverter can be electrically connected to the connecting section of the first and second switching element. A phase line of the primary winding structure can be connected to at least one AC phase line of the inverter. It is possible that said phase lines are directly connected or connected via/by a filter, e.g. a gyrator.

If the inverter is a three phase inverter, the inverter can comprise three legs with such a series connection of switching elements and three AC phase lines of the inverter. A switching element can preferably be a MOSFET. Alternatively, a switching element can be provided by an IGBT.

A converter can also have one or more AC phase lines which provide an AC output voltage for operating the primary winding structure. The converter can be a one-phase or a multiple-phase, in particular a three-phase converter. In case of a three-phase converter or inverter, the converter or inverter can have a so-called B6 topology.

At the phase line, AC phase voltage and the AC phase current are provided. The phase current can denote an AC output current of the converter if the converter provides an AC operating voltage to the AC phase line and thus to a primary winding structure connected to said AC phase line. The AC phase current can e.g. be the current flowing through a switching element of a converter leg into the respective phase line. The phase voltage can denote the voltage between the potential of the AC phase line and a reference potential.

Further, at least one phase current change dependent quantity is determined. This can mean that a time course of the phase current change dependent quantity is determined. The phase current change dependent quantity can be a quantity which depends on the change in time of the phase current.

The phase current change dependent quantity can e.g. by the phase current change, i.e. the first derivative of the phase current. Alternatively, the phase current change dependent quantity can be a second derivative, a third derivative, a fourth derivative or a derivative with a higher order than the fourth derivative of the phase current.

The phase current change dependent quantity can e.g. be measured directly by a sensor for measuring the phase current change dependent quantity, e.g. a phase current change sensor. It is, however, also possible, to determine the phase current change dependent quantity by calculation. One exemplary option is to measure phase current and to determine the phase current change dependent quantity depending on the measured phase current, e. g. by calculating the first derivative or a derivative of higher order of the phase current. Alternatively, it is possible to measure a further phase current dependent quantity, e.g. a phase current change, and to determine the desired phase current change dependent quantity depending on the measured further phase current change dependent quantity, e. g. by calculating a derivative of the further phase current change dependent quantity.

The phase current and the phase voltage can denote time courses of the phase current and the phase voltage.

The phase shift between the phase current and the phase voltage can denote the time difference between (related) zero crossings of phase current and the phase voltage respectively. The phase shift can also provided in form of a phase angle, in particular if a period of the phase current and the phase voltage is known.

The zero crossings denote related or associated zero crossings of the phase current and the phase voltage.

The time point of a zero crossing of the phase voltage can denote the time point at which the AC phase voltage takes a value which corresponds to a sum of a minimum potential, e.g. of a low potential, and half of the difference between a maximum potential, e.g. a high potential, and said minimum potential. The low potential can e.g. be the potential of the aforementioned low potential DC phase line and the high potential can e.g. be the potential of the aforementioned high potential DC phase line to which DC input terminals of the inverter are connected.

Further, a voltage-specific reference time point is determined depending on the at least one phase current change dependent quantity, in particular depending on the current change value. As mentioned before, the phase shift is determined as the time difference between time points, wherein the voltage-specific reference time point can provide the voltage-related time point within the said difference. The voltage-specific reference time point can correspond to the zero crossing of the phase voltage or does not deviate more than a predetermined amount from the time point of zero crossing.

Also, the voltage-specific reference time point can be determined depending on multiple different phase current change dependent quantities.

Further, the phase current is determined. The phase current can be measured, e.g. by a phase current sensor. Alternatively, the phase current can also be determined by means of calculation. It is, for instance, possible to measure the phase current change dependent quantity and to determine the phase current by integrating the phase current change over time at least once.

In other words, the phase current change dependent quantity and the phase current can be determined depending on an output signal of a single sensor, e. g. a single phase current change sensor or a single phase current sensor.

Further, a current-specific reference time point is determined depending on the phase current, in particular a time course of the phase current. The current-specific reference time point can correspond to the second time point of the time difference providing the phase shift. In particular, the current-specific time point be equal to the time point of zero crossing of the phase current or does not deviate more than a predetermined amount from said time point of zero crossing.

Further, the phase shift is determined depending on the time difference between the voltage-specific reference time point and the current-specific reference time point. In particular, the phase shift can be determined as time difference between the voltage-specific reference time point and the current-specific reference time point. It is, however, possible to change, e.g. increase or decrease the time difference between the voltage-specific reference time point and the current-specific reference time point in order to determine the phase shift. Said increase or decrease can e.g. reflect tolerances or dependencies on operating conditions, e.g. a temperature and so on.

The proposed method advantageously allows precisely determine a phase shift between the phase current and the phase voltage in an AC phase line of a converter without measuring or determining the phase voltage. This means that only a phase current-related signal, e.g. the phase current itself or the phase current change or a quantity depending on the phase current change, is measured in order to determine the phase shift.

The invention advantageously uses the idea of determining the phase shift independent of a measurement of a phase voltage, but based on a phase current change, in particular on a derivation of the time course of the phase current. In other words, information of the time course of the phase voltage encoded or contained in the time course of the phase current are determined which are then used to determine the phase shift.

In another embodiment, the voltage-specific reference time point is determined as the time point of zero crossing of the phase current change depending quantity, in particular the phase current change.

It can be assumed that a switching operation of a switching element of the converter results in a change of the absolute value of the phase current as well as in a change of the sign of the gradient of the phase current. In other words, the switching operation will result in a zero crossing of the phase current change or phase current change depending quantity.

In a switching operation, the phase voltage will also change, e.g. from a high potential to a low potential or from a low potential to a high potential. Therefore, the zero crossing of the phase current change or phase current change depending quantity is related or corresponds to the zero crossing of the phase voltage.

This advantageously allows to precisely determine the phase shift as the time point of zero crossing of the phase voltage is precisely determined.

In an alternative embodiment, a derivative of the phase current change depending quantity, in particular the phase current change, is determined by differentiating the quantity at least once. In other words, at least a first derivative of the phase current change can be determined. Alternatively or in addition, it is possible to determine a second, a third or derivative with even higher order of the phase current change. In other words, the derivative can be the first, the second, a third or even a further derivative of the phase current change.

Further, the voltage-specific reference time point is determined as the time point of a zero crossing of the derivative.

Determining a derivative and the time point of a zero crossing depending on the derivative advantageously increases a robustness and a precision of the determination. In particular in case of high resistance values of the load connected to the phase line and or high amounts of power provided to the phase line, the aforementioned change of the absolute value decreases which can lead to a more complicated detection of the change of the sign of the phase current. In other words, providing the derivative of the phase current change dependent quantity results in a larger ratio between a signal portion resulting from harmonic frequencies in the phase current change dependent quantity and the signal portion resulting from the fundamental frequency of the phase current change dependent quantity. Preferably, the voltage-specific reference time point is determined as a time point of a zero crossing of the first derivative of the phase current change. This advantageously provides a precise determination of the voltage-specific reference time point without being too sensitive to e.g. noise.

In another embodiment, the phase current is determined by integrating the phase current change dependent quantity over time, in particular once or more than once. In this case, the phase shift can e.g. be determined depending on a measured phase current change dependent quantity and independent of a measured phase voltage. This has been explained before. Further, this advantageously allows to determine the phase shift by providing only one sensor, e.g. one sensor per phase line of the converter, namely a sensor for a phase current change dependent quantity.

In another embodiment, the phase current change dependent quantity is determined by a Rogowski coil-based determining means. Such a Rogowski coil-based determining means e.g. allows to generate an output signal, e.g. a voltage signal, which represents the phase current change, in particular the first derivative of the time course of the phase current. In order to provide such a signal, the Rogowski coil-based determining means does not have an integrating means for integrating the output signal.

It is further possible to determine the phase current change dependent quantity as a second, a third or a further derivative of the time course of the phase current by differentiating the output signal of the Rogowski coil-based determining means.

In particular, the Rogowski coil-based determining means can be a Rogowski coil sensor or comprise such a Rogowski coil. The Rogowski coil-based determining means advantageously allows measuring or determining the phase current change dependent quantity precisely and robustly, in particular with a galvanic separation from the AC phase line.

Further, a Rogowsky coil-based determining means has a large bandwidth, i.e. an output signal provided by said Rogowski coil-based determining means changes with a minimal time delay if a phase current changes.

The Rogowski coil can comprise or be provided by a helical coil which can be wrapped around the phase line. A Rogowski coil-based determining means has a high electrical and mechanical insensitivity against short circuit currents. This means that the risk of a damage of the Rogowski coil-based determining means is small, even in case of a failure of the converter.

In another embodiment, the phase current change dependent quantity, in particular an actual value of the phase current change dependent quantity, is compared to a first predetermined reference value by a first comparing means. The comparing means can e.g. provided by a comparator or comparator circuit. The first predetermined reference value can e.g. be zero. It is, however, possible to select the first predetermined reference value depending on noise characteristics or operating dependencies of the phase current change dependent quantity or phase current determining means and the first comparing means. In this case, the first predetermined reference value can be different from zero.

Further, the phase current is compared to a further predetermined reference value by a further comparing means. The further comparing means can be provided by a further comparator or a further comparator circuit. The further predetermined reference value can e.g. be zero. It is, however, also possible to select the further predetermined reference value depending on noise characteristics and or operating dependencies of the phase current or phase current change dependent quantity determining means and the further comparing means.

The voltage-specific reference time point is determined depending on an output signal of the first comparing means. It is possible that the output signal can take only two values, a first value representing a logic "1" status and a further value representing a logic "0" status.

In this case, the voltage-specific reference time point can be determined as the time point at which an output signal of the first comparing means changes, in particular from the first value to the further value or vice versa. It is, for instance, possible to detect a rising or falling signal edge of the output signal. The voltage-specific reference time point can e.g. be the time point of detection or depend thereon.

Further, the current-specific reference time point is determined depending on an output signal of the further comparing means. It is possible that the output signal can take only two values, a first value representing a logic "1" status and a further value representing a logic "0" status.

As in the case of the voltage-specific reference time point, the current-specific reference time point can e.g. determined as the time point of a change of the further output signal, in particular a change from the first to the further value or vice versa. It is, for instance, possible to detect a rising or falling signal edge of the output signal. The current-specific reference time point can e.g. be the time point of detection or depend thereon.

This advantageously allows a robust and pre sized determination of the voltage-specific reference time point and the current-specific reference time point. Further, said determination can be performed with a high computational efficiency since only comparing means are used to determine the respective time points. In particular, there is need for a high computational power since no, especially fast, A/D converters are required to determine the voltage- and current-specific reference time point.

The determination of the voltage-specific reference time point depending on the output signals of the comparing means can e.g. be performed by an evaluation unit, e.g. an evaluation unit comprising a micro controller or a so-called FPGA.

In another embodiment, a trigger signal is generated wherein the voltage-specific reference time point and the current-specific reference time point are determined as time points within a time interval of predetermined duration after the trigger signal.

The predetermined duration can e.g. be chosen from a range of 1 to 10 microseconds, preferably from a range from 3 to 6 microseconds, more preferably from a range of 4 to 5 microseconds. Such a time duration can e.g. be chosen if the operating frequency is 20 kHz. It is, however, also possible to choose the predetermined duration from a range of 0.2 microseconds to 2.5 microseconds, preferably from a range from 0.6 to 1.5 microseconds, more preferably from a range of 1.0 to 1.25 microseconds. Such a time duration can e.g. be chosen if the operating frequency is 85 kHz.

Providing a trigger signal and determining the reference time points in the time interval after the trigger signal advantageously increase a robustness of the determination of the phase shift. It is possible, in particular under certain operation conditions, that the phase current change dependent quantity has multiple zero crossings within a short time interval wherein not all of the occurring zero crossings are related to a switching operation. By providing the trigger signal, the reliability of determining a time point related to a switching operation can be increased. The trigger signal can e.g. be generated depending on an occurring or upcoming switching operation. Such an occurring or upcoming switching operation can e.g. be detected.

It is possible that the phase current or phase current change dependent quantity is measured continuously. It is further possible that the phase current change dependent quantity and or the phase current is compared to a respective reference value continuously. In this case, it is further possible that the output signals of the aforementioned comparing means are analyzed in order to determine voltage- and current-specific reference time point only the aforementioned time interval after the trigger signal.

In another embodiment, the time point of generating the trigger signal is determined depending on a time point of a switch signal generation. In particular, the trigger signal can be generated if the switch signal is generated. The switch signal can e.g. be generated by a control unit for controlling the operation of the converter. The switch signal can e.g. be a signal provided to a gate input of a switching element. The switch signal is generated by the control unit and transferred or transmitted to the switching element. Further, the trigger signal can also be generated by the control unit and transmitted to the aforementioned evaluation unit.

In this case, the duration of the time interval should reflect the time delay between the switch signal generation and the actual switching operation. In particular, the time interval should be longer than said time delay.

Further proposed is a system for determining a phase shift between a phase current and a phase voltage in an AC phase line of a converter, in particular a converter of a system for inductive power transfer.

The system advantageously allows to perform a method according to one of the embodiments disclosed in this disclosure. In other words, the system is designed such that one of the aforementioned disclosed method can be performed by said system.

The system comprises at least one means for determining a phase current change dependent quantity. In particular, the system can comprise at least one phase current change sensor or a sensor for the phase current change dependent quantity. Alternatively, it is possible that the system can comprise a phase current sensor and at least one means for providing the first and/or a further derivative of the measured phase current.

Further, the system comprises at least one means for determining a voltage-specific reference time point depending on the phase current change dependent quantity. The at least one means can e.g. comprise or be provided by an evaluation unit, wherein the evaluation unit can e.g. comprise a micro controller or a FPGA. Further, the at least one means for determining a voltage-specific reference time point can comprise a comparing means, e.g. a comparator or a comparator circuit.

Further, the system comprises at least one means for determining a phase current. The at least one means for determining a phase current can be provided by a current sensor. Alternatively, the at least one means for determining the phase current can comprise at an integrating means for integrating the phase current change dependent quantity, wherein the phase current change dependent quantity is determined by the at least one means for determining the phase current change dependent quantity.

Further, the system comprises at least one means for determining a current-specific reference time point depending on the phase current. The means for determining a current-specific reference time point can e.g. comprise the aforementioned evaluation unit or a further evaluation unit.

Further, the means for determining the current-specific reference time point can comprise a further comparing means, e.g. a further comparator or a further comparator circuit.

Further, the system comprises at least one means for determining the phase shift depending on the time difference between the voltage-specific reference time point and the current-specific reference time point. The means for determining the phase shift can e.g. comprise the aforementioned evaluation unit or a further evaluation unit.

The system can further comprise a control unit for controlling an operation of the converter, e.g. for providing switch signals to the switching elements of the converter. The elements of the proposed system, in particular the means for determining the phase current, the phase current change dependent quantity, the voltage-specific and the current-specific reference time point and the phase shift can e.g. be connected by a signal or data connection. Further, said control unit and the means for determining the phase shift can be connected by a signal or data connection.

The system advantageously allows to determine the phase shift. First, the phase current changes or a quantity depending thereon is determinable, e.g. by the means for determining the phase current change dependent quantity. Further, the voltage-specific reference time point is determinable, e.g. by the means for determining the voltage-specific reference time point. Further, the phase current is determinable, e.g. by the means for determining the phase current. Further, the current-specific reference time point is determinable, e. g. by the means for determining the current-specific reference time point. Further, the phase shift is determinable, e.g. by the means for determining the phase shift.

In a preferred embodiment, the means for determining a phase current change dependent quantity comprises a Rogowski coil-based determining means. This and corresponding advantages have been explained before.

The system can further comprise the converter, e.g. an inverter.

Further described is a system for inductive power transfer, in particular to a vehicle, wherein the system comprises the converter, a primary winding structure and the system for determining a phase shift according to one of the embodiments disclosed in this disclosure.

Further described is a method for controlling operation of the converter, in particular of the converter of the system for inductive power transfer. It is e.g. possible to control the operation of the converter depending on the phase shift determined by a method according to one of the embodiments disclosed in this disclosure. In particular, it is possible to control switching operations of the switching elements of the converter such that the phase shift is reduced or minimized. In particular, switching operations of the switching elements of the converter can be controlled such that an operating frequency of the converter, in particular a fundamental frequency of the phase current and/or the phase voltage, corresponds to a resonant frequency of an electric circuit connected to the AC phase line.

Further described is a method of adjusting an impedance of an electric circuit connected to phase lines of the converter. The electric circuit can e.g. comprise the elements providing primary winding structure, e.g. coils. Further, the electric circuit comprises means for adjusting an impedance of the electric circuit or sections thereof. In particular, the electric circuit can comprise elements with an adjustable capacitance and or elements with an adjustable inductance. Further, the impedance of the electric circuit can be adjusted depending on the phase shift determined according to one of the method disclosed in this disclosure. In particular, the impedance can be adjusted such that a resonant frequency of the electric circuit corresponds to an operating frequency of the converter. The impedance of the electric circuit can e.g. be controlled by adjusting the impedance of the element(s) with an adjustable capacitance and or the inductance of the element(s) with adjustable inductance.

The invention described with reference to the attached figures. The figures show.

In the following, the same reference numerals denote elements with the same or similar technical features.

Figure 1:
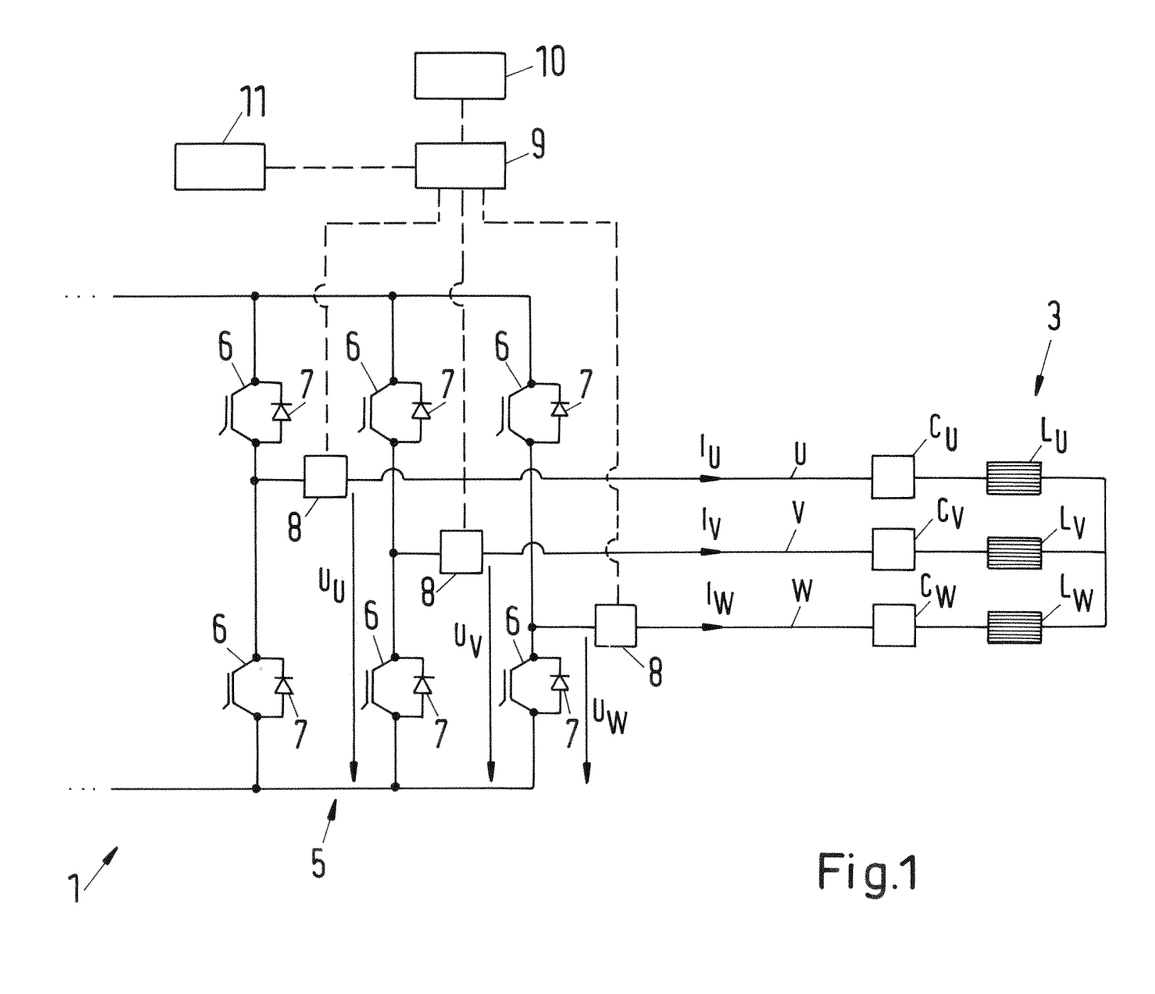
FIG. 1: A schematic circuit diagram of a primary unit system for inductive power transfer.

FIG. 1 shows a schematic circuit diagram of a primary unit 1 of a system for inductive power transfer 2 (not shown). The primary unit 1 comprises and inverter 5 which is designed with a B6 bridge topology. The inverter 5 comprises switching elements 6, wherein a bypass diode 7 is connected antiparallel to each switching element 6. The inverter 5 has three legs, wherein each leg comprises a series connection of two switching elements 6 and one phase line U, V, W is connected to a connecting section of the two switching elements 6.

In particular, a first switching element 6 is connected to a high potential phase line, wherein the second switching element 6 is connected to a low potential phase line.

The switching element 6 of the inverter can e.g. be provided by a MOSFET or an IBGT.

The inverter 5 generates or provides AC (alternating current) phase voltages $U_U$, $U_V$, $U_W$ for the phase lines U, V, W of the primary winding structure 3. AC output terminals of the inverter 5 are connected to the phase lines U, V, W, respectively. In the shown embodiment, these phase lines U, V, W of primary winding structure 3 are electrically connected to AC phase lines of the inverter 5. Thus, phase lines U, V, W also denote AC phase lines of the inverter 5.

The primary winding structure 3 is a three-phase winding structure. Schematically shown is an inductance $L_U$, $L_V$, $L_W$ provided by each phase line U, V, W. Further shown are compensating capacitances $C_U$, $C_V$, $C_W$ in each phase line U, V, W wherein a capacitance value of said capacitances $C_U$, $C_V$, $C_W$ is chosen such that the resonant frequency of the resonant circuit provided by the inductance $L_U$, $L_V$, $L_W$ and the capacitance $C_U$, $C_V$, $C_W$ of each phase line U, V, W matches an operating frequency f (see FIG. 5).

Further shown are AC phase currents $I_U$, $I_V$, $I_W$ in each phase line U, V, W which correspond to phase currents in AC phase lines of the inverter 5. In arrowhead of each phase current $I_U$, $I_V$, $I_W$ indicates a positive direction of the phase current $I_U$, $I_V$, $I_W$. A positive value of the phase current $I_U$, $I_V$, $I_W$ indicates a current flow with the indicated direction. AC phase voltages of the AC phase lines U, V, W are referenced by $U_U$, $U_V$, $U_W$.

A system 12 (see FIG. 2) for determining a phase shift between the phase currents $I_U$, $I_V$, $I_W$ and the phase voltages $U_U$, $U_V$, $U_W$ in each AC phase line U, V, W comprises a phase current change sensor 8 which provides a sensor for measuring a phase current change depending quantity and which measures the phase current change of phase currents $I_U$, $I_V$, $I_W$ in each phase U, V, W, wherein the phase current change provides the phase current change depending quantity. In particular, the phase current change sensors 8 measure the phase current change of the phase $I_U$, $I_V$, $I_W$ which flow through one switching element 6 of a leg of the inverter 5 into the respective phase line U, V, W. The phase current change sensor 8 can comprise a Rogowski coil 13 (see FIG. 2).

It is, however, also possible that the system 12 comprises a phase current sensor and at least one means for determining a derivative of the measured phase current $I_U$, $I_V$, $I_W$.

Further, the system 12 comprises an evaluation unit 9 which is connected to the phase current change sensors 8 by a signal link (shown by dash lines). The phase current change sensors 8 can provide samples of the measured phase current $I_U$, $I_V$, $I_W$. Further, the system comprises a memory unit 10 which is also connected to the evaluation unit 9 by a signal or data link. Further shown is a control unit 11 for controlling an operation of the inverter 5, e.g. of the switching elements 6. The control unit 11 is connected to the evaluation unit 9 by a signal or data link.

It is possible that the evaluation 9 determines a voltage-specific reference time point depending on the phase current change, in particular as the time point of a zero crossing of the phase current change provided by the phase current change sensor 8. Further, a phase current $I_U$, $I_V$, $I_W$ can be determined, in particular by integrating the phase current change over time. This can also be performed by the evaluation unit 9. Further, a current-specific reference time point can be determined depending on the phase current $I_U$, $I_V$, $I_W$, in particular a time point of zero crossing of the phase current $I_U$, $I_V$, $I_W$.

In addition or alternatively, it is possible that the evaluation 9 determines the voltage-specific reference time point depending on a first derivative or a derivative with a higher order of the phase current change.

Further, in particular by means of the evaluation 9, the phase shift can be determined depending on, in particular as, the time difference between the voltage-specific reference time point and the current-specific reference time point.

It is further possible that the evaluation unit determines a first derivative of the phase current change provided by the phase current change sensor 8. Then, the voltage-specific reference time point can be determined as the time point of a zero crossing of this first derivative.

Figure 2:
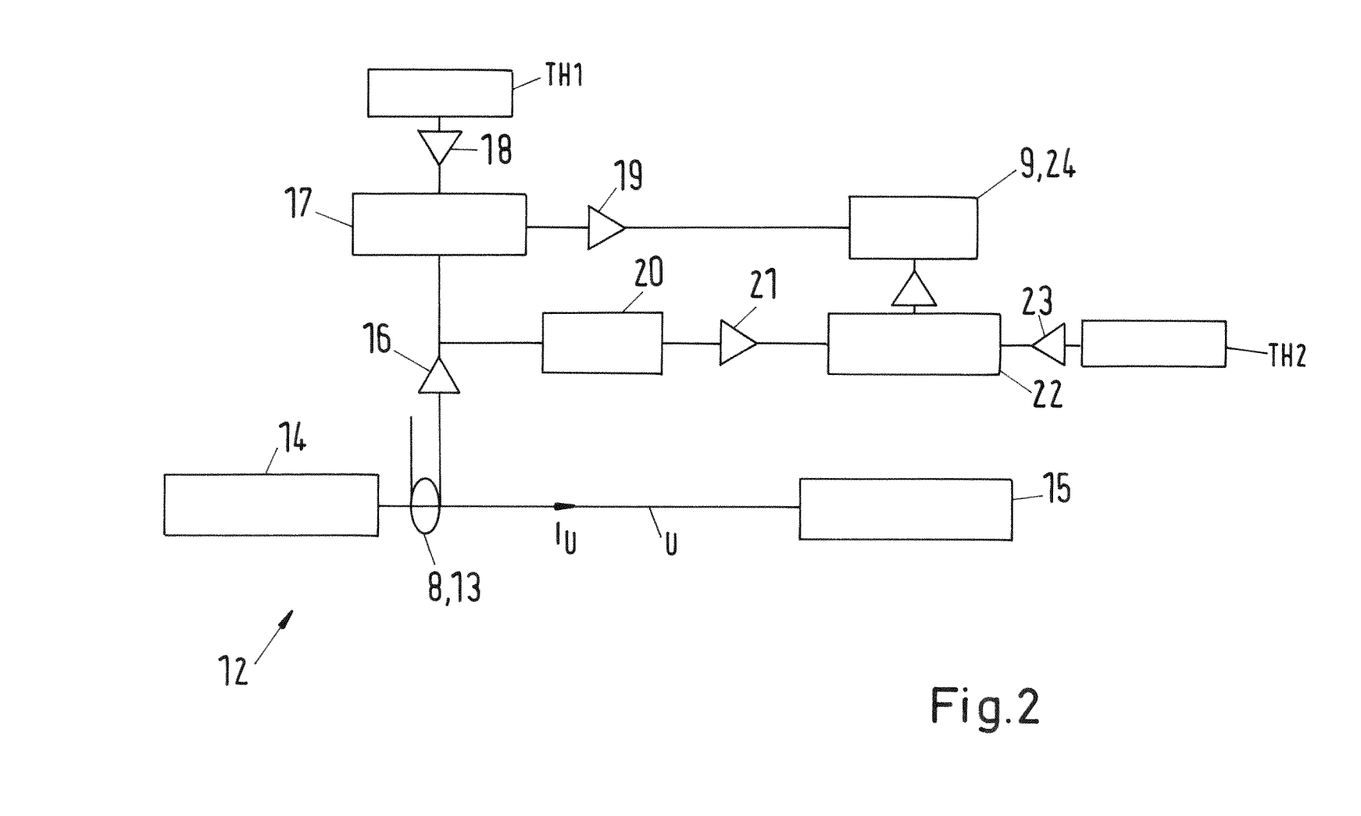
FIG. 2: A schematic block diagram of a system for determining a phase shift

FIG. 2 shows a schematic circuit diagram of a system for determining a phase shift between a phase current $I_U$, and a phase voltage $U_U$ (see FIG. 1) in an AC phase line U of an inverter 5 (see FIG. 1). FIG. 2 provides a schematic circuit diagram of said system for the first phase line U. A similar system can also be applied to the remaining phase lines V, W.

Schematically indicated is an AC input terminal 14 for the system 12 to which the AC phase current $I_U$ is provided. Further indicated is an AC output terminal 15, which can e.g. be connected to a phase line of the primary winding structure 3 (shown in FIG. 1).

Further shown is phase current sensor 8 with the Rogowski coil 13. The phase current change sensor 8 provides an output signal which is proportional to a change over time of the phase current $I_U$, i.e. a time derivative of the phase current $I_U$, The system comprises an amplifier 16 for amplifying the output signal of the phase current change sensor 8. The amplifier output signal is compared to a first threshold value TH1 by a first comparator 17. It is indicated that the first threshold TH1 is amplified by an amplifier 18 before being provided to the first comparator 17. The first threshold value TH1 can be zero or have a value close to zero. Thus, output signal of the first comparator 17 changes from signal representing a logical "1" status to a signal representing a logical "0" status or vice versa if the amplified output signal of the phase current change sensor 8 has a zero crossing. The output signal of the first comparator 17 is amplified by an amplifier 19 and provided to an evaluation unit 24. The output of the first comparator 17 can have a square form.

Further, the amplified output signal of the phase current change sensor 8 is provided to an integrator 20 which integrates the output signal of the phase current change sensor 8 over time. The integrated phase current change which corresponds to the phase current $I_U$ is amplified by an amplifier 21 and provided to a second comparator 22. Further, a second threshold value TH2 is amplified by an amplifier 23 and also provided to second comparator 22. The second threshold value TH2 can be zero or have a value close to zero. An output signal of the second comparator 22 changes from first signal representing e.g. a logic "1" status to a signal representing a logic "0" status if the phase current has a zero crossing. Thus, the output signal of the second comparator 22 can also have a square wave form.

The output signals of the comparators 17, 22 are provided to the evaluation unit 24 which can be equal to the evaluation unit 9 shown in FIG. 1. By means of the evaluation unit 24, signal edges, e.g. rising or falling signal edges, of the output signals provided by the comparators 17, 22 can be detected. The time point of the detection of such a signal edge in the amplified output signal of the first comparator 17 can correspond to a voltage-specific reference time point, wherein the time point of detection of a signal edge in the amplified output signal of the second comparator 22 can correspond to a current-specific reference time point.

Then, the evaluation means 24 can determine the phase shift as the time difference between the said voltage-specific reference time point and the current-specific reference time point.

It is further possible that the control unit 11 (see FIG. 1) generates a trigger signal if a switching signal for a switching element 6 in one leg of the inverter 5 is generated by the control unit 11, wherein said leg is connected to the phase line U for which the phase shift is to be determined. The trigger signal can be transmitted to the evaluation unit 24. Then, the voltage-specific reference time point and the current-specific reference time point are determined as time points within a time interval of predetermined duration after the reception of said trigger signal.

Figure 3:
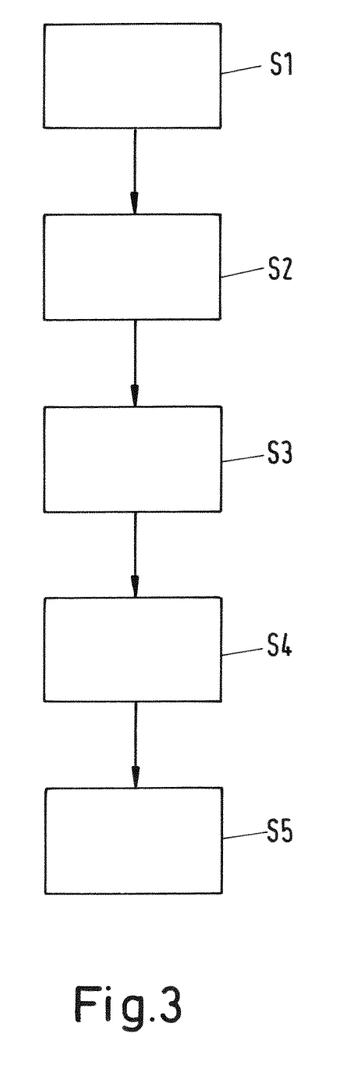
FIG. 3: A schematic flow diagram of a method for determining a phase shift according to the invention.

FIG. 3 shows a schematic flow diagram of a method for determining the phase shift between the phase current $I_U$, $I_V$, $I_W$ and a phase voltage $U_U$, $U_V$, $U_W$ in one of the AC phase lines U, V, W of an inverter 5 is shown. In a first step S1, a phase current change is determined, e.g. by measuring the phase current change with a Rogowski coil-based sensor 8. Further, in a second step S2, a voltage-specific reference time point is determined depending on the phase current change, in particular as the time point of a zero crossing of the phase current change. In a third step S3 a phase $I_U$, $I_V$, $I_W$ is determined, in particular by integrating the phase current change over time. In a fourth step S4, a current-specific reference time point is determined depending on the phase current $I_U$, $I_V$, $I_W$, in particular as the time point of a zero crossing of a phase current $I_U$, $I_V$, $I_W$. In a fifth step S5, a phase shift is determined depending on the time difference between the voltage-specific reference time point and the current-specific reference time point.

The sequence shown in FIG. 3 is not a mandatory sequence. It is for instance possible that single steps, in particular the second, third and fourth step S2, S3, S4 are performed simultaneously or at least partially simultaneously.

The invention claimed is:

1. A method for determining a phase shift between a phase current and a phase voltage in an AC phase line of a converter that carries a corresponding phase of an AC output of the converter, wherein a phase current change dependent quantity for the AC phase line is determined, wherein a voltage-specific reference time point for the AC phase line is determined depending on the phase current change dependent quantity, wherein the phase current for the AC phase line is determined, wherein a current-specific reference time point for the AC phase line is determined depending on the phase current, wherein the phase shift is determined depending on the time difference between the voltage-specific reference time point and the current-specific reference time point.

2. The method of claim 1, characterized in that the voltage-specific reference time point is determined as the time point of a zero crossing of the phase current change dependent quantity.

3. The method of claim 1, characterized in that a derivative of the phase current change dependent quantity is determined by differentiating the phase current change dependent quantity at least once, wherein the voltage-specific reference time point is determined as the time point of a zero crossing of the derivative.

4. The method of claim 1, characterized in that the phase current is determined by integrating the phase current change dependent quantity over time.

5. The method of claim 1, characterized in that the phase current change dependent quantity is determined by a Rogowski coil-based determining means.

6. The method of claim 1, characterized in that the phase current change dependent quantity is compared to a first predetermined reference value by a first comparing means, wherein the phase current is compared to a further predetermined reference value by a further comparing means, wherein the voltage-specific reference time point is determined depending on an output signal of the first comparing means, wherein the current-specific reference time point is determined depending on an output signal of the further comparing means.

7. The method of claim 1, characterized in that a trigger signal is generated, wherein the voltage-specific reference time point and the current-specific reference time point are determined as time points within a time interval of predetermined duration after the time point of generating the trigger signal.

8. The method of claim 7, characterized in that the time point of generating the trigger signal is determined depending on a time point of a switch signal generation.

9. The method of claim 1, wherein the converter is a converter of a system for inductive power transfer.

10. The method of claim 1, wherein:
the converter is a three-phase converter comprising at least one leg having a series connection of first and second switching elements, the first switching element having first and second terminals, and the second switching element having first and second terminals;
the first terminal of the first switching element is electrically connected to a high potential DC line;
the second terminal of the first switching element is electrically connected to the first terminal of the second switching element to provide a connecting section;
the second terminal of the second switching element is electrically connected to a low potential DC line; and
the AC phase line is electrically connected to the connecting section.

11. The method of claim 1, wherein the phase current change dependent quantity is a quantity that depends on a change in time of the phase current.

12. A system for determining a phase shift between a phase current and a phase voltage in an AC phase line of a converter that carries a corresponding phase of an AC output of the converter, wherein the system comprises at least one means for determining a phase current change dependent quantity for the AC phase line, at least one means for determining a voltage-specific reference time point for the AC phase line depending on the phase current change dependent quantity, at least one means for determining a phase current for the AC phase line, at least one means for determining a current-specific reference time point for the AC phase line depending on the phase current and at least one means for determining the phase shift depending on the time difference between the voltage-specific reference time point and the current-specific reference time point.

13. The system of claim 12, characterized in that the means for determining a phase current change dependent quantity comprises a Rogowski coil-based determining means.

14. The system of claim 12, wherein the converter is a converter of a system for inductive power transfer.

15. The system of claim 12, wherein:
the converter is a three-phase converter comprising at least one leg having a series connection of first and second switching elements, the first switching element having first and second terminals, and the second switching element having first and second terminals;
the first terminal of the first switching element is electrically connected to a high potential DC line;
the second terminal of the first switching element is electrically connected to the first terminal of the second switching element to provide a connecting section;
the second terminal of the second switching element is electrically connected to a low potential DC line; and
the AC phase line is electrically connected to the connecting section.

16. The system of claim 12, wherein the phase current change dependent quantity is a quantity that depends on a change in time of the phase current.

* * * * *